United States Patent [19]
Agata et al.

[11] Patent Number: 5,389,810
[45] Date of Patent: Feb. 14, 1995

[54] SEMICONDUCTOR DEVICE HAVING AT LEAST ONE SYMMETRICAL PAIR OF MOSFETS

[75] Inventors: Masashi Agata, Osaka; Hiroyuki Yamauchi, Takatsuki; Toshio Yamada, Kadoma, all of Japan

[73] Assignee: Matsushita Electric Industrial Co., Ltd., Osaka, Japan

[21] Appl. No.: 35,731

[22] Filed: Mar. 23, 1993

[30] Foreign Application Priority Data

Mar. 27, 1992 [JP] Japan ................... 4-070755

[51] Int. Cl.$^6$ ........................... H01L 29/78
[52] U.S. Cl. ........................... 257/369; 257/390; 257/401; 257/618; 257/653; 257/773
[58] Field of Search ............ 257/369, 390, 401, 618, 257/653, 773

[56] References Cited

FOREIGN PATENT DOCUMENTS

| | | |
|---|---|---|
| 0222396 | 5/1987 | European Pat. Off. . |
| 0445725 | 9/1991 | European Pat. Off. . |
| 58-207677 | 2/1983 | Japan . |
| 61-290767 | 12/1986 | Japan . |
| 62-115861 | 5/1987 | Japan . |
| 2159054 | 6/1990 | Japan . |
| 336301 | 5/1991 | Japan . |
| 513713 | 1/1993 | Japan . |

OTHER PUBLICATIONS

Search Report for European Appl. 93104940.7 mailed Oct. 4, 1993.

*Primary Examiner*—Edward Wojciechowicz
*Attorney, Agent, or Firm*—Renner, Otto, Boisselle & Sklar

[57] ABSTRACT

A semiconductor device having at least one symmetrical pair of MOSFETs is provided. The device includes a semiconductor layer having an upper surface, an active region formed in the upper surface, an isolation region formed in the upper surface and enclosing the active region, and a pair of MOSFETs formed in the active region, wherein the pair of MOSFETs are symmetrical with respect to a first symmetric plane substantially vertical to the upper surface and also with respect to a second symmetric plane vertical both to the upper surface and to the first symmetric plane, each of the pair of MOSFETs includes a source region, a drain region, and a channel region formed in an upper surface of the active region, the source region is shared by the pair of MOSFETs, and the drain region is spatially isolated from the source region by the channel region.

30 Claims, 4 Drawing Sheets

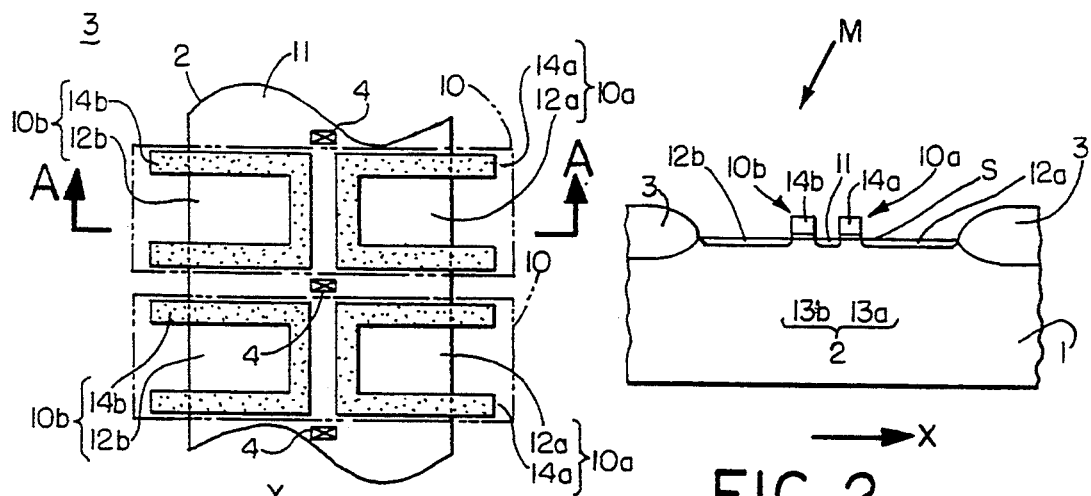
FIG. 1
FIG. 2
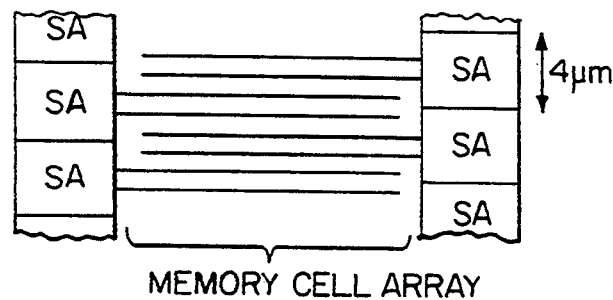
FIG. 3
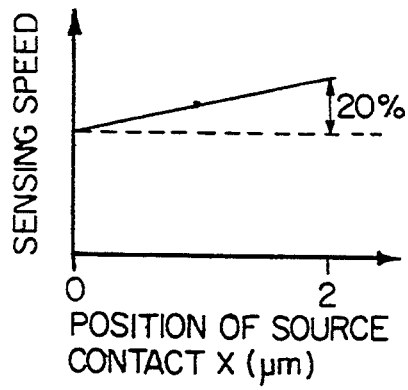
FIG. 5
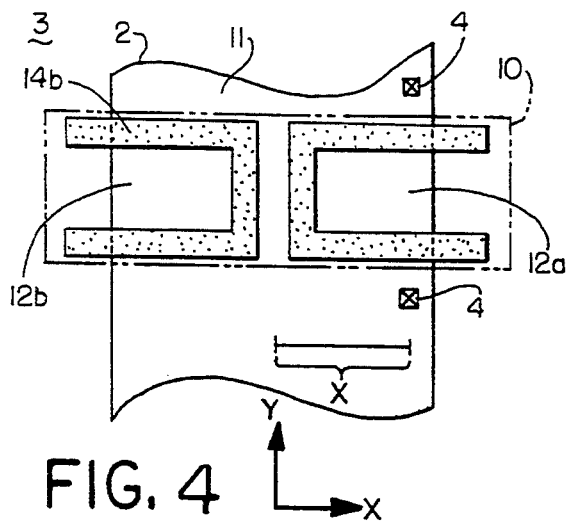
FIG. 4
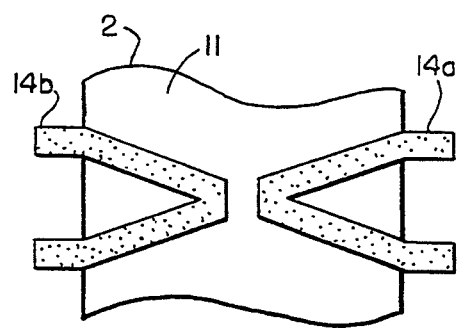
FIG. 6

SEMICONDUCTOR DEVICE HAVING AT LEAST ONE SYMMETRICAL PAIR OF MOSFETS

BACKGROUND OF THE INVENTION

1. Field of the Invention

The present invention relates to a semiconductor device having at least one symmetrical pair of MOSFETs (metal oxide semiconductor field effect transistors).

2. Description of the Related Art

A semiconductor device such as a sense amplifier is provided with a pair of MOSFETs.

In recent efforts for increasing the memory capacity of the semiconductor memory device, the size of memory cells has been reduced and the integration level of the semiconductor memory device has been enhanced. In order to increase the memory capacity of the semiconductor memory device, it is also required that the size of a sense amplifier be reduced. Generally, with the reduction of the size of the semiconductor device, the shape and size of the device element are liable to change depending on a variation of process parameters for fabricating such a semiconductor device, and desired electrical properties may not be obtained from the resultant semiconductor device.

In a sense amplifier, the pair of MOSFETs are required to be highly symmetrical. When this symmetry is lowered due to a variation of process parameters as described above, such a semiconductor device can not operate as desired.

FIG. 11 shows a typical circuit configuration of a sense amplifier. In FIG. 11, a first bit line pair bit1 and $\overline{\text{bit1}}$ are connected to one sense amplifier SA, and a second bit line pair bit2 and $\overline{\text{bit2}}$ are connected to another sense amplifier SA. Each sense amplifier SA includes a pair of MOSFETs. FIG. 12 schematically shows a circuit configuration of the pair of MOSFETs required to be highly symmetrical. The pair of MOSFETs are composed of a first MOSFET and a second MOSFET. The first MOSFET has a source region 110, a drain region 120a and a gate electrode 140a, while the second MOSFET has the source region 110 shared with the first MOSFET, a drain region 120b and a gate electrode 140b. In such a sense amplifier SA, the first and the second MOSFETs must be equivalent in their electrical properties. In other words, the first and the second MOSFETs must be highly symmetrical.

FIG. 13 shows a layout for a conventional sense amplifier. FIG. 14 is a sectional view taken along line B—B of FIG. 13. A plurality of active regions 20a and 20b isolated from each other by an isolation region 3 are formed in an upper surface portion of a semiconductor layer (substrate) 1. Bit line pairs bit1, $\overline{\text{bit1}}$, bit2, $\overline{\text{bit2}}$, ... extend in a first direction X. The plurality of active regions 20a and the plurality of active regions 20b are arranged in a row, respectively, along a second direction Y. The sense amplifier for sensing the bit line pair bit1 and $\overline{\text{bit1}}$, for example, includes a pair of MOSFETs composed of a first MOSFET and a second MOSFET. The first and the second MOSFETs have gate electrodes 14a and 14b corresponding to the gate electrodes 140a and 140b of FIG. 12, respectively. Likewise, the source region 110 and the drain regions 120a and 120b of FIG. 12 correspond to a source region 11 and drain regions 12a and 12b, respectively.

In the above conventional sense amplifier, the first and the second MOSFETs are formed in the respective active regions 20a and 20b which are isolated by the isolation region 3 as shown in FIG. 14.

The above conventional sense amplifier has problems as to the symmetry. The symmetric electrical properties of the pair of MOSFETs may be lowered when the source region 11 and the drain regions 12a and 12b are formed by ion implantation. This is because the ion implantation is performed at an angle inclined by approximately 7° from the normal of the upper surface of the semiconductor layer 1. This oblique ion implantation prevents channeling of implanted ions. However, this results in that the position of channel regions which should be located directly under the gate electrodes 14a and 14b is shifted in a certain direction with respect to the gate electrodes 14a and 14b. With this shift, the positions of the source region 11 and the drain regions 12a and 12b with respect to the gate electrodes 14a and 14b become asymmetrical. As a result, the symmetric electrical properties of the pair of MOSFETs may be lowered.

Another problem is that since the isolation region 3 exists between the first and the second MOSFETs, it is difficult to reduce the size of the sense amplifier.

FIG. 15 shows a layout for another conventional sense amplifier. FIG. 16 is a sectional view taken along line C—C of FIG. 15. This sense amplifier does not have an isolation region between paired first and second MOSFETs. The first and the second MOSFETs include U-shaped gate electrodes 14a and 14b, respectively. Regions cut apart from an active region 2 by the U-shaped gate electrodes 14a and 14b as viewed from the layout of FIG. 15 are drain regions 12a and 12b, respectively. In this configuration, the drain regions 12a and 12b are isolated from each other without the provision of an isolation region.

According to this conventional sense amplifier, the problem caused by the oblique ion implantation can be solved. This is because the asymmetry caused by the shift of the positions of a source region 11 and the drain regions 12a and 12b with respect to the gate electrodes 14a and 14b can be mutually compensated.

This sense amplifier, however, still has a problem. When the resistance of one of a plurality of source contacts 4 disposed on the source region 11 changes, the symmetry of the pair of MOSFETs is lowered.

This problem will be described with reference to FIGS. 17A and 17B.

FIG. 17A shows a circuit diagram with the conditions where the resistance of the bit line pairs is 5 kΩ, the capacity thereof is 100 fF, the resistance of the source contacts is 10 Ω, and the sheet resistance of the source region is 100 Ω/□. Assume that the resistance of one of the source contacts is increased to 1 kΩ due to the attachment of dust thereto during a fabricating process, as shown in FIG. 17B. A simulation test was performed using these conditions to examine how the change in the resistance of the source contact affects the symmetry of the sense amplifier. The result was that the sensing speed of the sense amplifier was reduced by approximately 20%.

The above problem with the source contacts is liable to occur for a reduced-size sense amplifier used for a DRAM. Therefore, such a sense amplifier has a higher probability of incurring malfunction caused by such defective source contacts.

SUMMARY OF THE INVENTION

The semiconductor device of this invention includes a semiconductor layer having an upper surface; an active region formed in the upper surface; an isolation region formed in the upper surface and enclosing the active region; and a pair of MOSFETs formed in the active region; wherein the pair of MOSFETs are symmetrical with respect to a first symmetric plane substantially vertical to the upper surface and also with respect to a second symmetric plane vertical both to the upper surface and to the first symmetric plane; each of %he pair of MOSFETs includes a source region, a drain region, and a channel region formed in the upper surface of the active region; the source region is shared by the pair of MOSFETs; and the drain region is spatially isolated from the source region by the channel region.

In an embodiment, the channel region is substantially of a U-shape.

In an embodiment, the channel region is substantially of an O-shape.

In an embodiment, each of the pair of MOSFETs includes a gate electrode located directly above the channel region and defining the shape of the channel region.

In an embodiment, the source region and %he drain region are self-aligned with respect to the gate electrode.

In an embodiment, the semiconductor device further includes a plurality of pairs of MOSFETs having the same configuration as that of the pair of MOSFETs.

In an embodiment, the gate electrode includes a first portion substantially parallel to the upper surface and the first symmetric plane and a second portion electrically connected to the first portion and parallel to the first portion.

In an embodiment, the first portion and the second portion cross the boundary of the active region and the isolation region.

In an embodiment, the gate electrode includes a third portion electrically connecting each end of the first portion and the second portion, and the third portion is substantially parallel to the second symmetric plane.

In an embodiment, the widths of the first portion and the second portion are smaller than that of the third portion.

In an embodiment, the gate electrode includes a fourth portion electrically connecting the first portion and the second portion, and the fourth portion is substantially parallel with the third portion.

In an embodiment, the fourth portion crosses the boundary of the active region and the isolation region.

In an embodiment, the gate electrode includes a ring-shaped portion.

In an embodiment, the ring-shaped portion of the gate electrode is located in the active region without extending across the boundary of the active region and the isolation region.

In an embodiment, the ring-shaped portion of the gate electrode extends across the boundary of the active region and the isolation region.

In an embodiment, the source region includes a plurality of contact regions at positions along a line where the upper surface of the semiconductor layer and the second symmetric plane cross.

Alternatively, the semiconductor device includes: a semiconductor layer having an upper surface; an active region formed in the upper surface; an isolation region formed in the upper surface and enclosing the active region; and a pair of MOSFETs formed at the active region; wherein the pair of MOSFETs include a pair of gate electrodes; the pair of electrodes are symmetrical with respect to a first symmetric plane substantially vertical to the upper surface and also with respect to a second symmetric plane vertical both to the upper surface and to the first symmetric plane; each of the pair of electrodes includes a first portion and a second portion extending along the first symmetric plane, a third portion electrically connecting each one end of the first portion and the second portion, and a fourth portion electrically connecting the first portion and the second portion; and the fourth portion is located across the boundary of the active region and the isolation region.

In an embodiment, the widths of the first portion and the second portion are smaller than that of the third portion.

Thus, the invention described herein makes possible the advantages of (1) providing a semiconductor device having at least a pair of MOSFETs in which the symmetry of the pair of MOSFETs can be well maintained even when process parameters change during the fabrication process, and (2) providing a semiconductor device having at least a pair of MOSFETs in which the size on the layout can be reduced for high integration.

These and other advantages of the present invention will become apparent to those skilled in the art upon reading and understanding the following detailed description with reference to the accompanying figures.

BRIEF DESCRIPTION OF THE DRAWINGS

FIG. 1 is a plan view of a semiconductor device according to the present invention.

FIG. 2 is a sectional view taken along line A—A of FIG. 1.

FIG. 3 is a schematic plan view showing the arrangement of sense amplifiers and bit line pairs according to the present invention.

FIG. 4 is a view showing a shift in the position of source contacts.

FIG. 5 shows the relationship between the shift in the position of source contacts and the sensing speed of the sense amplifier.

FIG. 6 is a plan view showing V-shaped gate electrodes.

DESCRIPTION OF THE PREFERRED EMBODIMENTS

EXAMPLE 1

Figure 7:
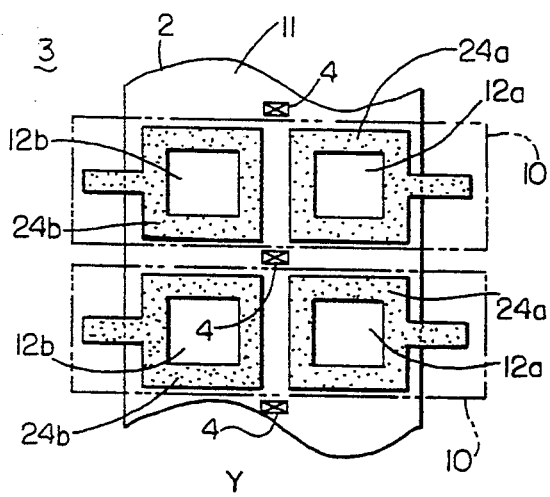
FIG. 7 is a plan view of another semiconductor device according to the present invention.

FIG. 1 schematically shows the plane configuration of a main portion of a semiconductor device according to the present invention. FIG. 2 is a sectional view taken along line A—A of FIG. 1.

The semiconductor device of this example is a sense amplifier for a DRAM. As shown in FIG. 2, the sense amplifier includes a semiconductor layer 1 which may be a single-crystal semiconductor substrate, an active region 2 formed in an upper surface portion of the semiconductor layer 1, and isolation regions 3 for isolating the active region 2 from other active regions for other devices such as DRAM memory cells constituting a semiconductor memory device.

As shown in FIG. 1, a plurality of pairs of MOSFETs 10 are arranged in a row in the active region 2. Each pair of MOSFETs 10, composed of a first MOSFET 10a and a second MOSFET 10b, constitutes a sense amplifier SA and corresponds to the pair of MOSFETs shown in FIG. 12.

The pair of MOSFETs 10 have a first symmetry plane parallel to a first direction X shown in FIG. 1. The first symmetry plane is vertical to an upper surface S of the semiconductor layer 1 shown in FIG. 2. The pair of MOSFETs 10 also have a second symmetry plane parallel to a second direction Y shown in FIG. 1. The second symmetry plane is vertical to both the upper surface S of the semiconductor layer 1 and the first symmetry plane.

As shown in FIG. 2, the first and the second MOSFET 10a and 10b include a source region 11, drain regions 12a and 12b, and channel regions 13a and 13b, respectively, formed in the upper surface portion of the active region 2. The source region 11 is shared by the first and the second MOSFETs 10a and 10b. The source region 11 and the drain regions 12a and 12b are impurity-diffused regions formed in the active region 2 of the semiconductor layer 1. When the first and the second MOSFETs 10a and 10b are of an n-channel type, the active region 2 is a p-type region formed in the semiconductor layer 1 at a low concentration, and the source region 11 and the drain regions 12a and 12b are regions formed by implanting n-type impurities in the active region 2 at a comparatively high concentration. As mentioned above, the source region 11 is shared by the first and the second MOSFETs 10a and 10b. On the other hand, the drain regions 12a and 12b are isolated from the shared source region 11 by the respective channel regions 13a and 13b.

The first and the second MOSFETs 10a and 10b also include gate electrodes 14a and 14b located above the channel regions 13a and 13b, respectively. The shape of the gate electrodes 14a and 14b defines the shape and location of the channel regions 13a and 13b, respectively. The source region 11 and the drain regions 12a and 12b are formed by self-alignment with respect to the gate electrodes 14a and 14b.

The configuration of the pair of MOSFETs 10 for the sense amplifier of this example will be described in more detail.

As shown in FIG. 1, each of the gate electrodes 14a and 14b includes a first portion substantially parallel to the upper surface S of the semiconductor layer 1 and the first symmetry plane, a second portion substantially parallel to the first portion, and a third portion connecting the first and the second portions. Both the first and the second portions have a width of 0.8 μm and a length of 2 μm. The third portion has a width of 0.8 μm and a length of 2 μm. The width and the length of the gate electrodes 14a and 14b correspond to the channel length (L) and the channel width (W) of the first and the second MOSFETs 10a and 10b, respectively. The channel length and the channel width of the first and the second MOSFETs 10a and 10b of this example are 0.8 μm and about 4 μm, respectively. The distance between the third portions of the first and the second MOSFETs is 0.6 μm. The width of the active region 2 is measured along the first direction X is approximately 6 μm.

Figure 13:
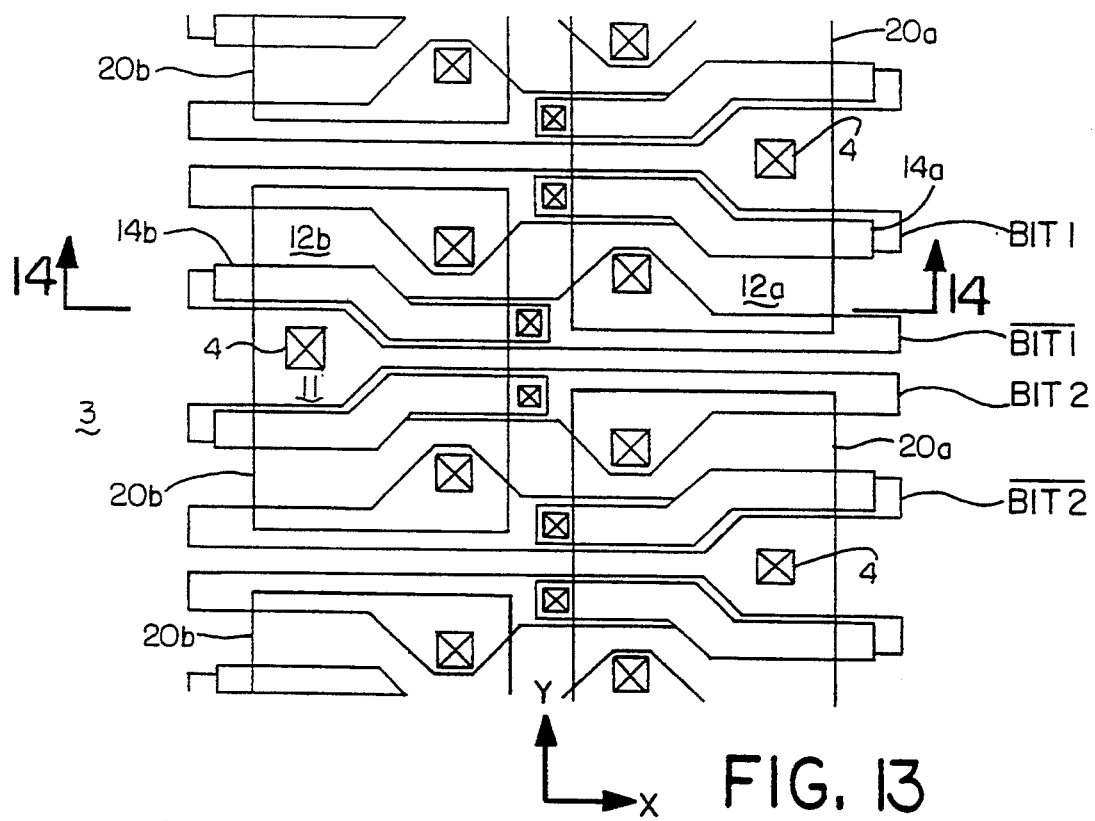
FIG. 13 is a plan view of a conventional sense amplifier.
Figure 14:
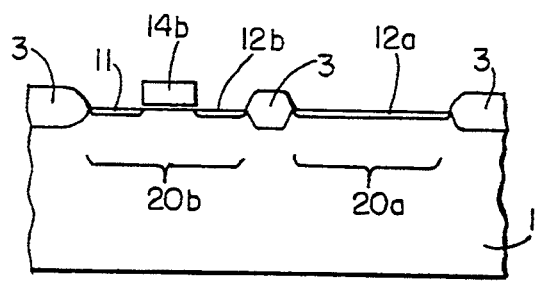
FIG. 14 is a sectional view taken along line B—B of FIG. 13.

The first and the second portions of the gate electrodes 14a and 14b cross the boundary of the active region 2 and the isolation region 3. By this arrangement, the drain regions 12a and 12b are completely isolated from the source region 11 by the U-shaped gate electrodes 14a and 14b. According to the conventional layout shown in FIG. 13, the width of the active region 2 as measure along the first direction X is approximately 10 μm on the basis of the same design rule as that adopted in this example. This is due to the necessity of disposing the isolation region 3 having a width of 0.6 μm or more between the first and the second MOSFETs. Since the width of the active region 2 required for this example is about 6 μm as mentioned above, the area occupied by the row of the sense amplifiers of this example in the entire semiconductor memory device can be reduced by 40%.

The gate electrodes 14a and 14b can be formed into a desired shape normally by patterning a layer made of electrode material by photolithography and etching. The actual gate electrodes 14a and 14b are not required to have a shape formed of only linear components as shown in FIG. 1. They may be partially curved so as to form a round U-shape. The effects of the present invention described layer can be provided regardless of the material, sectional structure, and size of the gate electrodes 14a and 14b.

As shown in FIG. 2, the channel regions 13a and 13b are formed in the upper surface portion of the active region 2 directly under the gate electrodes 14a and 14b. In other words, the channel regions 13a and 13b having substantially the same plane shape as the gate electrodes 14a and 14b are formed in the active region 2, located between the source region 11 shared by the first and the second MOSFETs 10a and 10b and the respective drain regions 12a and 12b. The size of the channel regions 13a and 13b can be adjusted as desired by changing the shape (width and length) of the gate electrodes 14a and 14b. When the sense amplifier is operated, the conductivity of the channel regions 13a and 13b can be controlled by varying the electrical potential applied to the corresponding gate electrodes 14a and 14b.

The source region 11 and the drain regions 12a and 12b can be formed in a self-alignment fashion by ion implantation using the gate electrodes 14a and 14b as a mask after the formation of a desired shape of the gate electrodes 14a and 14b. The shape and the position of the channel regions 13a and 13b are not necessarily identical to those of the gate electrodes 14a and 14b because of the oblique ion implantation and the diffusion of the implanted impurities in a lateral direction at an annealing step after the ion implantation. For example, when impurity ions are implanted into the semiconductor layer 1 from a direction shown by arrow M in FIG. 2, both the source region 11 and the drain regions 12a and 12b are shifted with respect to the gate electrodes 14a and 14b in a direction opposite to the first direction X.

A lightly doped drain (LDD) region and a punch through stopper region may be formed between the source region 11 and the channel regions 13a and 13b and between the drain regions 12a and 12b and the channel regions 13a and 13b.

AS shown in FIG. 1, a plurality of pairs of MOSFETs 10 are formed in a row along the second direction Y. When the sense amplifier is used for sensing a bit line pair, the row includes the same number of pairs of MOSFETs 10 as that of the bit line pairs. When a semiconductor memory cell includes total 1024 bit line pairs, 1024 pairs of MOSFETs 10 are arranged in a row in the active region 2. The length of the active region 2 as measured along the second direction Y in this case is approximately 4 mm (4 $\mu$m $\times$ 1024).

A plurality of source contacts 4 are formed between the adjacent pairs of MOSFETs 10 in at positions along a line parallel to the second direction Y. The source contacts 4 electrically connect the source region 11 formed in the active region 2 to an interconnection not shown. Only three source contacts are shown in FIG. 1. However, according to this example, substantially %he same number of source contacts 4 as that of pairs of MOSFETs 10 are formed. The electrical potential of the interconnection connected to the source contacts 4 corresponds to that at the terminal (source region) 110 of the circuit shown in FIG. 12. In the sense amplifier of this example, the size of the source contacts 4 is typically 0.6$\times$0.6 $\mu$m. The distance between the adjacent source contacts 4 is approximately 4 $\mu$m, which is equal to the length of one sense amplifier measured along the second direction Y.

Figure 15:
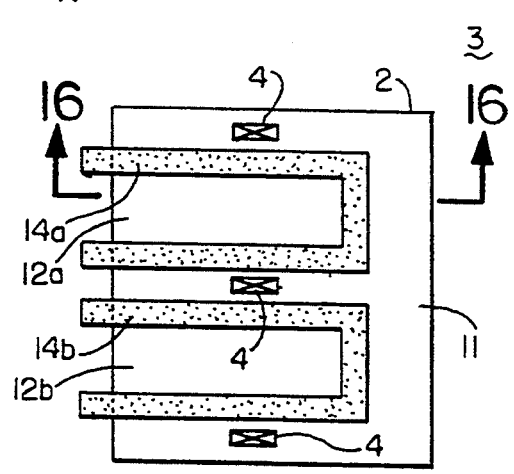
FIG. 15 is a plan view of another conventional sense amplifier.
Figure 16:
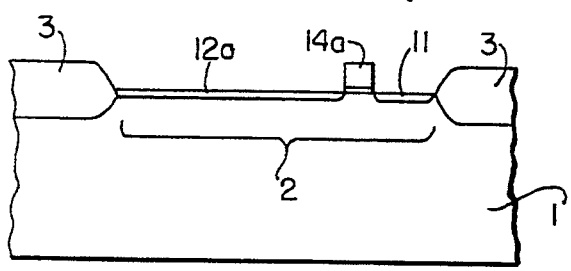
FIG. 16 is a sectional view taken along line C—C of FIG. 15.
Figure 17A:
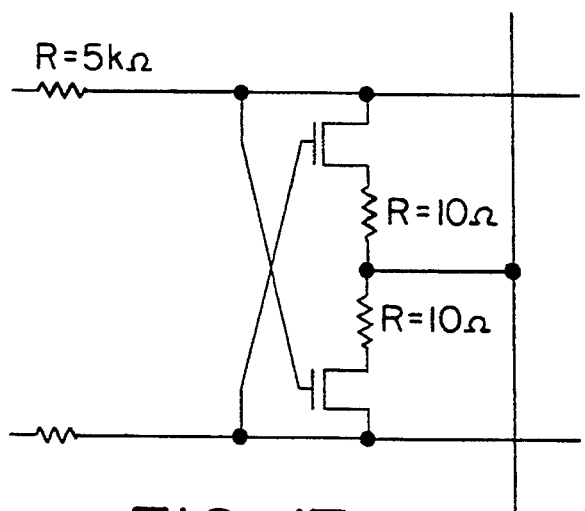
FIGS. 17A and 17B are circuit diagrams illustrating a problem caused by a defective source contact.
Figure 17B:
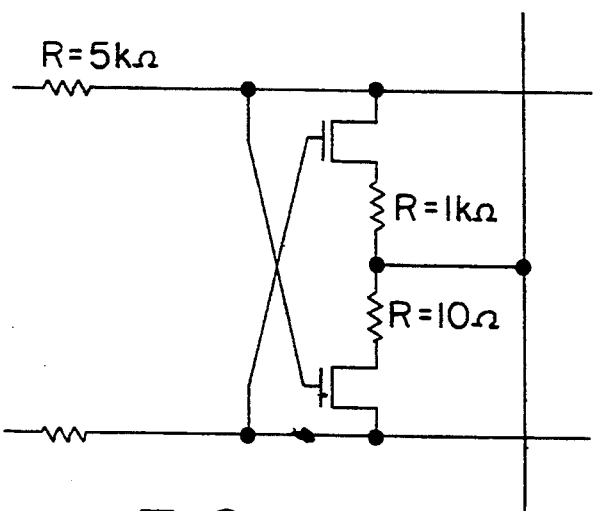

FIG. 3 schematically shows an arrangement of the sense amplifiers of this example and bit line pairs for a semiconductor memory device, where the row of the sense amplifiers is arranged on each side of a memory cell array. With this arrangement, sensing of the bit lines arranged at 1 $\mu$m intervals is possible. On the other hand, when the conventional sense amplifiers shown in FIG. 15 are used, a spacing as large as 2 $\mu$m is required between the adjacent bit lines. Generally, a spacing as small as 1 $\mu$m is necessary for a 64-megabit DRAM. Therefore, such conventional sense amplifiers can not be used for the 64-megabit DRAM. On the other hand, the sense amplifiers of this example are suitable for such a highly integrated semiconductor memory device.

A drain contact is disposed on each of the drain regions 12a and 12b so as to connect it to an interconnection. Such drain contacts are connected to the bit line pairs as shown in FIG. 3.

According to the sense amplifiers of this example, even when the resistance of one of the source contacts 4 changes due to some reason or other, the symmetric electrical properties of each pair of MOSFETs 10 remain maintained. This is because the change in resistance of the source contact equally effects both the first and the second MOSFETs 10a and 10b.

In this example, the source contacts 4 are arranged in a row along the second direction Y. However, they can be arranged in two or more rows. The number of the source contacts 4 can be a half of the number of pairs of MOSFETs 10. In these cases, the source contacts 4 should preferably be arranged symmetrically with respect to the second symmetry plane so that the electrical properties of the first and the second MOSFETs 10a and 10b can be equal. In the case of arranging the source contacts 4 are arranged in two rows, the resistance of one of the opposing source contacts 4 become significantly high, the parasitic resistances of the first and the second MOSFETs 10a and 10b become different from each other, causing lowering of the properties of the sense amplifier. In view of the above, the arrangement of the source contacts 4 in one row is most preferable.

In the case where the position of the row of the source contacts 4 is shifted in the first direction X, the source resistances of the first and the second MOSFETs 10a and 10b become slightly different from each other. FIG. 4 shows the case where the row of the source contacts 4 is shafted in the first direction X by a distance x from the position of the second symmetry plane. FIG. 5 shows the relationship between the distance X and the sensing speed of the sense amplifier. When the source contacts 4 are arranged as shown in FIG. 4, the source parasitic resistance of the first MOSFETs 10 is 10 $\Omega$, while that of the second MOSFETs 10b is as low as 1 k$\Omega$, for example. The sensing speed in this case lowers by approximately 20%. Accordingly, in order to maintain the symmetry of the pair of MOSFETs 10 and prevent lowering of the sensing speed, it is preferable to dispose the row of the source contacts 4 at a position closer to the second symmetry plane.

The source contacts 4 may be designed to locate across the second symmetry plane on the layout. However, the position is mostly shifted to some extent due to miss-alignment in a photolithography process. However, such a shift is normally 1 $\mu$m or less, only causing a slight change in the source parasitic resistance. Accordingly, the shift of the source contacts 4 produced during the fabrication process hardly affects the properties of the sense amplifier.

When the sheet resistance of the source region 11 is sufficiently low, one source contact 4 for every plural pairs of MOSFETs 10 may be disposed. This reduces the number of the source contacts 4 and thus contributes to further decreasing the length of the row of sense amplifiers as measured along the second direction Y. The decrease in the number of the source contacts 4 does not affect the symmetry of the first and the second MOSFETs 10a and 10b of each pair of MOSFETs 10. Moreover, it provides another advantage of reducing the probability of having a defective source contact in the whole semiconductor memory device.

In this example, the shape of the gate electrodes 14a and 14b as viewed on the plane layout is of U-shape. However, the shape thereof can be of V-shape as shown in FIG. 6.

EXAMPLE 2

FIG. 7 schematically shows the plane configuration of a main portion of another sense amplifier according to the present invention. Like components are denoted as like reference numerals as in Example 1 shown in FIGS. 1 and 2.

The sense amplifier of this example includes a pair of MOSFETs 10, and a plurality of pairs of MOSFETs 10 are arranged An a row in an active region 2. Each pair of MOSFETs 10 are composed of a first MOSFET 10a and a second MOSFET 10b. As in Example 1, each pair of MOSFETs 10 have a first symmetry plane parallel to a first direction X shown in FIG. 7. The pair of MOSFETs 10 also have a second symmetry plane parallel to a second direction Y shown in FIG. 7. The first and the second MOSFETs 10a and 10b include a source region 11, drain regions 12a and 12b, and channel regions 13a and 13b, respectively, formed in the upper surface portion of the active region 2. The source region 11 is shared by the first and the second MOSFETs 10a and 10b. The drain regions 12a and 12b are isolated from the source region 11 by the corresponding channel regions 13a and 13b.

Each of the gate electrodes 24a and 24b has first and second portions substantially parallel to the first symmetry plane, and a third portion substantially parallel to the second symmetry plane for electrically connecting each end of the first and the second portions. Each of the gate electrodes 24a and 24b further includes a fourth portion for electrically connecting the first and the second portion. The fourth portion is parallel to the third portion and connects the first and the second portions so as to complete a ring-shaped gate electrode 24a or 24b.

As shown in FIG. 7, the active region 2 is divided into the source region 11 and a plurality of drain regions 12a and 12b by the ring-shaped gate electrodes 24a and 24b. In Example 1 shown in FIG. 1, part of each of the channel regions 13a and 13b reaches the boundary of the active region 2 and the isolation region 3. However, in this example, the channel regions 13a and 13b between the source region 11 and the drain regions 12a and 12b are entirely located in the active region 2. This configuration is advantageous because the area of each of the channel regions 13a and 13b does not change even when the position of the gate electrodes 24a and 24b is shifted to some extent with respect to the active region 2 due to a reason such as miss-alignment in a photolithography process.

For example, assume that the ring-shaped gate electrodes 24a and 24b are located inside the active region 2 from the boundary with the isolation region 3 by a margin of 1 μm. In this case, even when the gate electrodes 24a and 24b are shifted in the first direction X by 1 μm, the width of each of the channel regions 13a and 13b is kept unchanged. As a result, the pair of MOSFETs 10 can maintain their symmetric electrical properties. The larger the margin is, the larger shift of the position of the gate electrodes 24a and 24b can be neglected, and thus the effective channel width of each of the channel regions 13a and 13b can be kept unchanged.

The gate electrodes 24a and 24b (i.e., the channel regions 13a and 13b) can have any shape including an oval, a triangle, and a polygon as far as such a shape is topologically equivalent to the ring shape used for this example. Generally, in a process for fabricating a semiconductor device, electrodes are formed by transferring a pattern to a photoresist formed on an in-process layer by use of a photomask having this pattern. Even when a square pattern as shown in FIG. 7 has been formed on the photomask, a resultant pattern transferred to the photoresist may be curved. Obviously, the same effects as described above can be obtained regardless whether the gate electrodes 24a and 24b are formed of only linear components or not.

The channel regions 13a and 13b are formed in the upper surface portion of the active region 2 directly under the gate electrodes 24a and 24b. In other words, the channel regions 13a and 13b having a plane shape substantially identical to that of the gate electrodes 24a and 24b are formed in the active region 2. In the sense amplifier of this example, the channel regions 13a and 13b are of ring shape and located between the source region 11 shared by the first and the second MOSFETs 10a and 10b and the respective drain regions 12a and 12b. The size of the channel regions 13a and 13b can be controlled by adjusting the shape (width and length) of the gate electrodes 24a and 24b. The regions enclosed by the ring-shaped portions of the gate electrodes 24a and 24b are completely included within the active region 2 as viewed from the layout.

As described above, even when the position of the gate electrodes 24a and 24b is shifted in the first direction X to some extent with regard to the active region 2, the size of each of the channel regions 13a and 13b is kept unchanged. As a result, the pair of MOSFETs 10 can maintain the symmetric electrical properties.

The plurality of pairs of MOSFETs 10 are arranged in a row along the second direction Y and each of them is symmetrical with regard to a line parallel to the second direction Y. A plurality of source contacts 4 are formed at positions along the line parallel to the second direction Y.

Thus, according to this example, even when the position of the gate electrodes 24a and 24b is shifted in the first direction X and in the second direction Y to some extent with regard to the active region 2, the size of each of the channel regions 13a and 13b is kept unchanged. Moreover, each pair of MOSFETs 10 can be kept symmetrical against a variation in the resistance of the source contacts 4.

EXAMPLE 3

Figure 8:
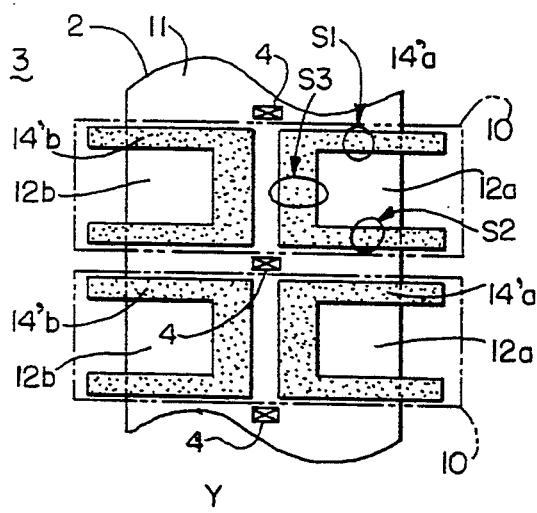
FIG. 8 is a plan view of yet another semiconductor device according to the present invention.

FIG. 8 schematically shows the plane configuration of a main portion of still another semiconductor device according to the present invention. The semiconductor device of this example basically has a configuration similar to that of Example 1 shown in FIG. 1. In this example, only portions different from Example 1 will be described.

Each of gate electrodes 14'a and 14'b of this example includes a first portion (gate length: L1, gate width: W1) substantially parallel to the upper surface of the semiconductor layer 1 and the first symmetry plane, a second portion (gate length: L2, gate width: W2) substantially parallel to the first portion, and a third portion (gate length: L3, gate width: W3) connecting each one end of the first and the second portions. The gate length corresponds to the width of each portion of the gate electrode, and the gate width corresponds to the length thereof. The difference of the gate electrodes 14'a and 14'b of this example from the gate electrodes 14a and 14b of Example 1 is that the gate lengths L1 and L2 are shorter than the gate length L3.

It is possible to consider that each of the MOSFETs 10a and 10b is composed of three sub-MOSFETs sharing the source region 11 and the drain regions 12a and 12b with one another. The three sub-MOSFETs are a sub-MOSFET S1 including the first portion of the gate electrode 14'a or 14'b, a sub-MOSFET S2 including the second portion thereof, and a sub-MOSFET S3 including the third portion thereof.

As shown in FIG. 8, the sub-MOSFETs S1 and S2 are symmetrical to each other with respect to the first symmetry plane. Precisely, however, a slight difference in the electrical properties may arise between the sub-MOSFETs S1 and S2. This is due to the following reason. In general, the source region 11 and the drain regions 12a and 12b are formed by ion implantation after the formation of the gate electrodes 14'a and 14'b. At the ion implantation, impurity ions are implanted into a single-crystal semiconductor substrate in a direction inclined from the normal of the upper surface of the substrate, so as to prevent channeling of the ions. As a result, the source region 11 and the drain regions 12a and 12b become slightly asymmetric with regard to the gate electrodes 14'a and 14'b. However, since each of the MOSFETs 10a and 10b includes the sub-MOSFETs S1 and S2, the asymmetry of each of the sub-MOSFETs S1 and S2 can be canceled.

As for the sub-MOSFET S3, however, such an effect of canceling the asymmetry is not provided. According to this example, the channel length of the Sub-MOSFET S3 is larger than those of the sub-MOSFETs S1 and S2, so that the sub-MOSFET S3 contributes less to the sensitivity of the sense amplifier than the Sub-MOSFETs S1 and S2. As a result, the sensing speed will be little affected by the asymmetry of the sub-MOSFET S3.

Figure 9:
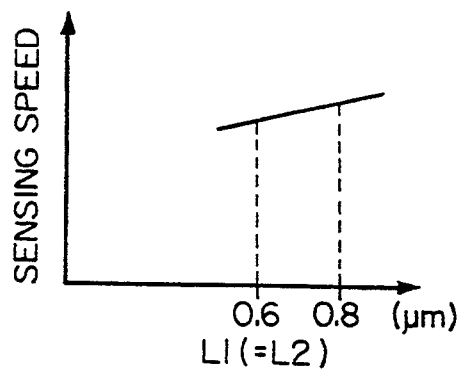
FIG. 9 shows the relationship between the sensing speed and the channel length of the sense amplifier of FIG. 8.

The above effect can be explained by the following equation:

$$We/Le=(W1/L1+W2/L2+W3/L3)/3$$

wherein Le is the effective channel length of the MOSFETs 10a and 10b, We is the effective channel width thereof, L1, L2, and L3 are respective channel lengths of the sub-MOSFETs S1, S2, and S3, and W1, W2, and W3 are respective channel widths thereof. When W1, W2, and W3 are all 1.3 μm and L3 is 0.8 μm, it is found that the sensing speed of the sense amplifier when L1 and L2 are 0.6 μm is higher than when they are 0.8 μm by approximately 18% (FIG. 9).

Thus, according to the sensing amplifier of this example, an influence from the asymmetry caused by the oblique ion implantation can be minimized, and moreover the sensing speed can be increased.

EXAMPLE 4

Figure 10:
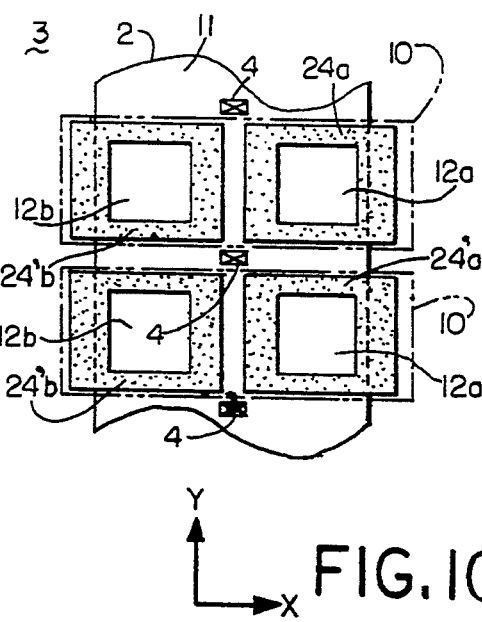
FIG. 10 is a plan view of yet another semiconductor device according to the present invention.

FIG. 10 schematically shows the plan configuration of a main portion of yet another semiconductor device according to the present invention. The semiconductor device of this example basically has a configuration similar to that of Example 2 shown in FIG. 7. In this example, only portions different from Example 7 will be described.

Each of gate electrodes 24'a and 24'b of this example includes a first portion (width: 0.6 μm) substantially parallel to the upper surface of the semiconductor layer 1 and the first symmetry plane, a second portion (width: 0.6 μm) substantially parallel to the first portion, a third portion (width: 0.8 μm) connecting each end of the first and the second portions, and a fourth portion (width: 0.6 μm or more) connecting the first and the second portions. The differences of the gate electrodes 24'a and 24'b of this example from the gate electrodes 24a and 24b of FIG. 7 are that the gate lengths of the third and the fourth portions are larger than those of the first and the second portions and that the fourth portion crosses the boundary of active region 2 and the isolation region 3.

According to the sense amplifier of this example, in addition to the effects obtained in Example 2, the width of the active region 2 in the first direction X can be reduced. This is advantageous for the application to a highly-integrated semiconductor memory device because for such a device it is significantly important to reduce the area occupied by the sense amplifiers or the like. The sense amplifier of this example is especially suitable for realizing a DRAM with a memory capacity of 64 megabits or more.

Figure 12:
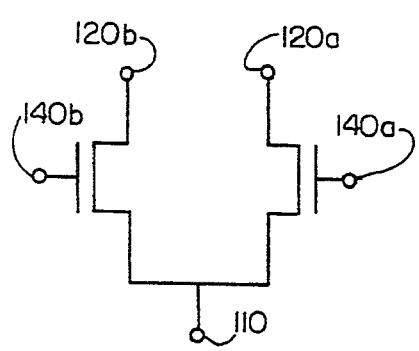
FIG. 12 is a circuit diagram of a pair of MOSFETs for a sense amplifier.
Figure 11:
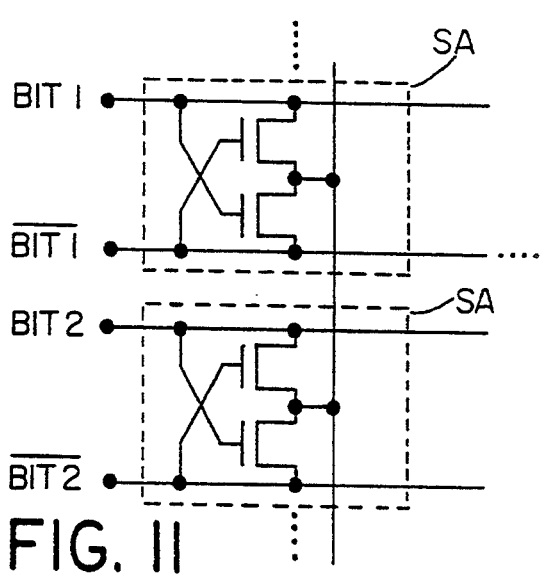
FIG. 11 is a circuit diagram of a sense amplifier.

The sense amplifier has been used for describing the present invention. However, the present invention includes all semiconductor devices having a highly-symmetrical pair of MOSFETs with a circuit configuration as shown in FIG. 12.

Thus, according to the semiconductor device of the present invention, the symmetric electrical properties of the pair of MOSFETs can be well maintained even when process parameters change during a fabrication process. Moreover, since the size on the layout can be reduced, the application to a highly-integrated semiconductor memory device is possible. Furthermore, since the area of the drain regions can be reduced, the parasitic drain capacity can be reduced, thereby increasing the operation speed of the semiconductor device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a semiconductor layer having an upper surface;
   an active region formed in said upper surface;
   an isolation region formed in said upper surface and enclosing said active region; and
   a pair of MOSFETs formed in said active region;
   wherein said pair of MOSFETs include a pair of gate electrodes;
   each of said pair of electrodes is symmetrical with respect to a first symmetric plane substantially normal to said upper surface, and one of said pair of electrodes is symmetrical with the other of said pair of electrodes with respect to a second symmetric plane normal both to said upper surface and to said first symmetric plane;
   each of said pair of electrodes includes a first portion and a second portion each having a length extending in a direction parallel to said first symmetric plane, a third portion electrically connecting respective ends of said first portion and said second portion, and a fourth portion electrically connecting respective other ends of said first portion and said second portion; and
   said fourth portion is extended across the boundary of said active region and said isolation region.

2. A semiconductor device according to claim 1, wherein the widths of said first portion and said second portion are smaller than that of said third portion.

3. A semiconductor device comprising:
   a semiconductor layer having an upper surface;
   an active region formed in said upper surface;
   an isolation region formed in said upper surface and enclosing said active region; and
   a pair of MOSFETs formed in said active region, each of said pair of MOSFETs including a source region, a drain region, and a substantially U-shaped channel region formed in said active region;
   wherein said source region, said drain region and said channel region of each of said pair of MOSFETs are symmetrical with respect to a first symmetric plane substantially normal to said upper surface, and said source region, said drain region and said channel region of one of said pair of MOSFETs are symmetrical with said source region, said drain region and said channel region, respectively, of the other of said pair of MOSFETs with respect to a second symmetric plane normal both to said upper surface and to said first symmetric plane;

said source region for each of said MOSFETs is shared by said pair of MOSFETs; and said drain region for each of said MOSFETs is spatially isolated from said source region by said channel region.

4. A semiconductor device according to claim 3, wherein each of said pair of MOSFETs comprises a gate electrode located directly above said channel region and defining the shape of said channel region.

5. A semiconductor device according to claim 4, wherein said source region and said drain region are self-aligned with respect to said gate electrode.

6. A semiconductor device according to claim 3, further comprising a plurality of pairs of MOSFETs having the same configuration as that of said pair of MOSFETs.

7. A semiconductor device according to claim 4, wherein said gate electrode includes a first portion substantially parallel to said upper surface and said first symmetric plane and a second portion electrically connected to said first portion and parallel to said first portion.

8. A semiconductor device according to claim 7, wherein said first portion and said second portion cross the boundary of said active region and said isolation region.

9. A semiconductor device according to claim 8, wherein said gate electrode includes a third portion electrically connecting each end of said first portion and said second portion, and said third portion is substantially parallel to said second symmetric plane.

10. A semiconductor device according to claim 9, wherein the widths of said first portion and said second portion are smaller than that of said third portion.

11. A semiconductor device according to claim 9, wherein said gate electrode includes a fourth portion electrically connecting said first portion and said second portion, and said fourth portion is substantially parallel with said third portion.

12. A semiconductor device according to claim 11, wherein said fourth portion crosses the boundary of said active region and said isolation region.

13. A semiconductor device according to claim 4, wherein said gate electrode includes a ring-shaped portion.

14. A semiconductor device according to claim 13, wherein said ring-shaped portion of said gate electrode is located in said active region without extending across the boundary of said active region and said isolation region.

15. A semiconductor device according to claim 13, wherein said ring-shaped portion of said gate electrode extends across the boundary of said active region and said isolation region.

16. A semiconductor device according to claim 3, wherein said source region includes a plurality of contact regions at positions along a line where said upper surface of said semiconductor layer and said second symmetric plane cross.

17. A semiconductor device comprising:
a semiconductor layer having an upper surface;
an active region formed in said upper surface;
an isolation region formed in said upper surface and enclosing said active region; and
a pair of MOSFETs formed in said active region, each of said pair of MOSFETs including a source region, a drain region, and a substantially O-shaped channel region formed in said active region;

wherein said source region, said drain region and said channel region of each of said pair of MOSFETs are symmetrical with respect to a first symmetric plane substantially normal to said upper surface, and said source region, said drain region and said channel region of one of said pair of MOSFETs are symmetrical with said source region, said drain region and said channel region, respectively, of the other of said pair of MOSFETs with respect to a second symmetric plane normal both to said upper surface and to said first symmetric plane;

said source region for each of said MOSFETs is shared by said pair of MOSFETs; and said drain region for each of said MOSFETs is spatially isolated from said source region by said channel region.

18. A semiconductor device according to claim 17, wherein each of said pair of MOSFETs comprises a gate electrode located directly above said channel region and defining the shape of said channel region.

19. A semiconductor device according to claim 18, wherein said source region and said drain region are self-aligned with respect to said gate electrode.

20. A semiconductor device according to claim 17, further comprising a plurality of pairs of MOSFETs having the same configuration as that of said pair of MOSFETs.

21. A semiconductor device according to claim 18, wherein said gate electrode includes a first portion substantially parallel to said upper surface and said first symmetric plane and a second portion electrically connected to said first portion and parallel to said first portion.

22. A semiconductor device according to claim 21, wherein said first portion and said second portion cross the boundary of said active region and said isolation region.

23. A semiconductor device according to claim 22, wherein said gate electrode includes a third portion electrically connecting each end of said first portion and said second portion, and said third portion is substantially parallel to said second symmetric plane.

24. A semiconductor device according to claim 23, wherein the widths of said first portion and said second portion are smaller than that of said third portion.

25. A semiconductor device according to claim 23, wherein said gate electrode includes a fourth portion electrically connecting said first portion and said second portion, and said fourth portion is substantially parallel with said third portion.

26. A semiconductor device according to claim 25, wherein said fourth portion crosses the boundary of said active region and said isolation region.

27. A semiconductor device according to claim 18, wherein said gate electrode includes a ring-shaped portion.

28. A semiconductor device according to claim 27, wherein said ring-shaped portion of said gate electrode is located in said active region without extending across the boundary of said active region and said isolation region.

29. A semiconductor device according to claim 27, wherein said ring-shaped portion of said gate electrode extends across the boundary of said active region and said isolation region.

30. A semiconductor device according to claim 17, wherein said source region includes a plurality of contact regions at positions along a line where said upper surface of said semiconductor layer and said second symmetric plane cross.

* * * * *